(12) United States Patent
Ambrose et al.

(10) Patent No.: US 10,879,447 B2
(45) Date of Patent: Dec. 29, 2020

(54) REPEATING ALTERNATING MULTILAYER BUFFER LAYER

(71) Applicants: Thomas F. Ambrose, Crownsville, MD (US); Melissa G. Loving, College Park, MD (US)

(72) Inventors: Thomas F. Ambrose, Crownsville, MD (US); Melissa G. Loving, College Park, MD (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 0 days.

(21) Appl. No.: 16/352,542

(22) Filed: Mar. 13, 2019

(65) Prior Publication Data

US 2020/0295249 A1 Sep. 17, 2020

(51) Int. Cl.
| | |
|---|---|
| *H01L 39/12* | (2006.01) |
| *H01L 39/22* | (2006.01) |
| *H01L 43/10* | (2006.01) |
| *H01L 43/02* | (2006.01) |
| *H01L 27/22* | (2006.01) |

(Continued)

(52) U.S. Cl.
CPC .......... *H01L 39/223* (2013.01); *G11B 5/3146* (2013.01); *G11C 11/161* (2013.01); *G11C 11/44* (2013.01); *H01F 10/3254* (2013.01); *H01F 10/3272* (2013.01); *H01F 41/32* (2013.01); *H01L 27/222* (2013.01); *H01L 39/025* (2013.01); *H01L 39/12* (2013.01);

(Continued)

(58) Field of Classification Search
CPC ....................................................... H01L 39/128
See application file for complete search history.

(56) References Cited

U.S. PATENT DOCUMENTS

| 8,213,130 | B1* | 7/2012 | Fuji | ........................ B82Y 10/00 360/324 |
|---|---|---|---|---|
| 2020/0152851 | A1* | 5/2020 | Lanting | ................. H01L 39/025 |

OTHER PUBLICATIONS

Mitchell, et al., "Structure and Mechanical Properties of Copper/Niobium Multilayers", 1997, Journal of the American Ceramic Society, 80: 1673-1676. doi:10.1111/j.1151-2916.1997.tb03037.x (Year: 1997).*

(Continued)

*Primary Examiner* — Peniel M Gumedzoe
*Assistant Examiner* — Christopher A Johnson
(74) *Attorney, Agent, or Firm* — Tarolli, Sundheim, Covell & Tummino LLP

(57) ABSTRACT

A buffer layer can be used to smooth the surface roughness of a galvanic contact layer (e.g., of niobium) in an electronic device, the buffer layer being made of a stack of at least four (e.g., six) layers of a face-centered cubic (FCC) crystal structure material, such as copper, the at least four FCC material layers alternating with at least three layers of a body-centered cubic (BCC) crystal structure material, such as niobium, wherein each of the FCC material layers and BCC material layers is between about five and about ten angstroms thick. The buffer layer can provide the smoothing while still maintaining desirable transport properties of a device in which the buffer layer is used, such as a magnetic Josephson junction, and magnetics of an overlying magnetic layer in the device, thereby permitting for improved magnetic Josephson junctions (MJJs) and thus improved superconducting memory arrays and other devices.

20 Claims, 8 Drawing Sheets

(51) Int. Cl.
     *H01L 43/12*      (2006.01)
     *H01L 39/24*      (2006.01)
     *G11B 5/31*       (2006.01)
     *H01L 39/02*      (2006.01)
     *H01F 10/32*      (2006.01)
     *G11C 11/16*      (2006.01)
     *G11C 11/44*      (2006.01)
     *H01F 41/32*      (2006.01)

(52) U.S. Cl.
     CPC .......... *H01L 39/2493* (2013.01); *H01L 43/02* (2013.01); *H01L 43/10* (2013.01); *H01L 43/12* (2013.01)

(56) References Cited

OTHER PUBLICATIONS

Baranov, et. al. "Superconducting superlattices", Sov. Phys. JETP 64 (3). Sep. 1986. Zh. Eksp. Teor. Fiz. 91, 1063-1073 (Sep. 1986). (Year: 1986).*

* cited by examiner

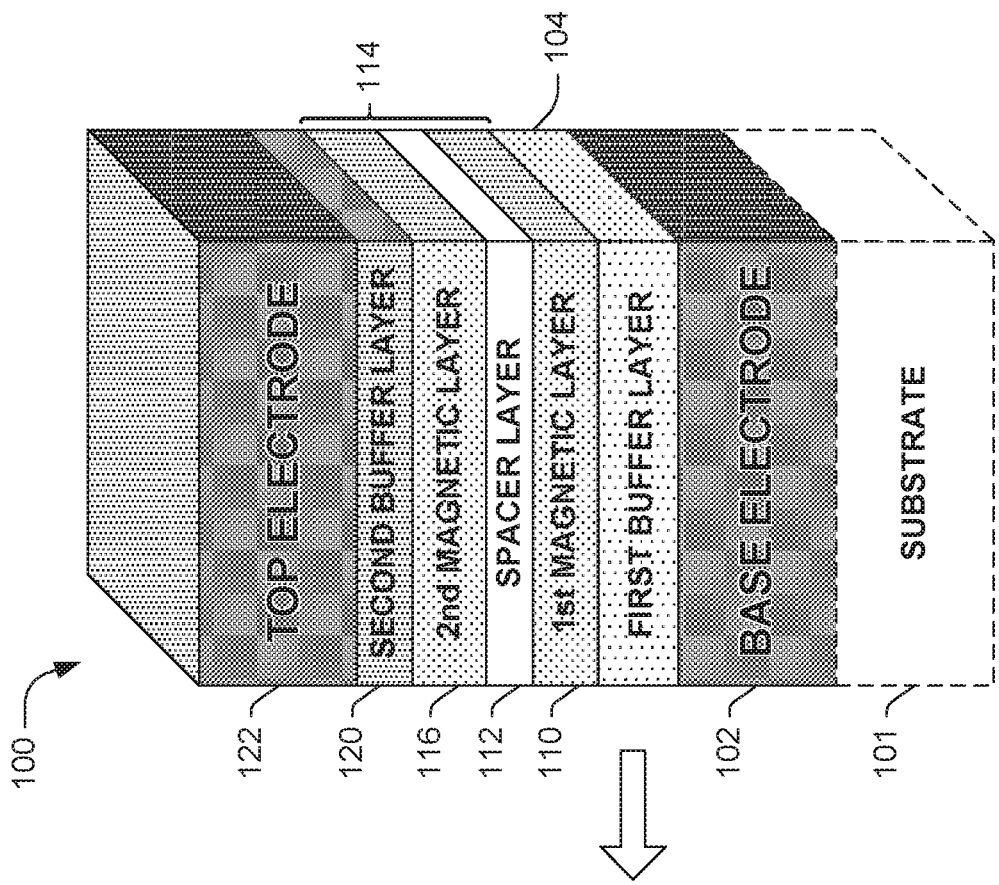
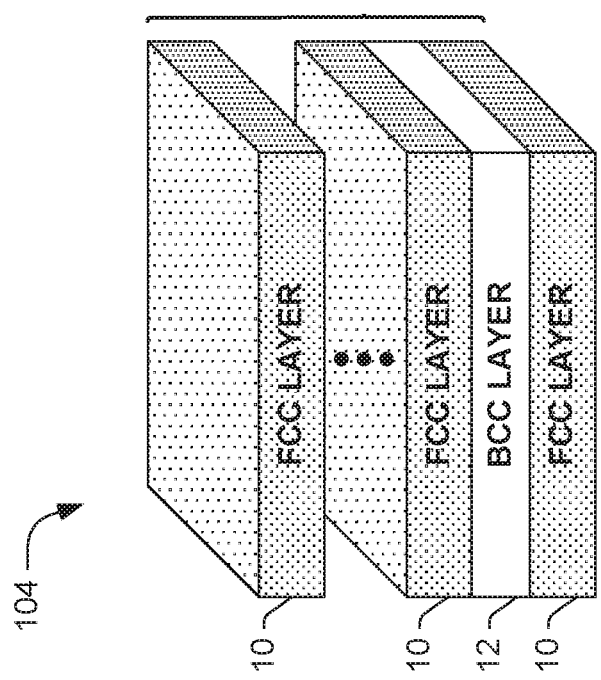
FIG. 1A
FIG. 1B

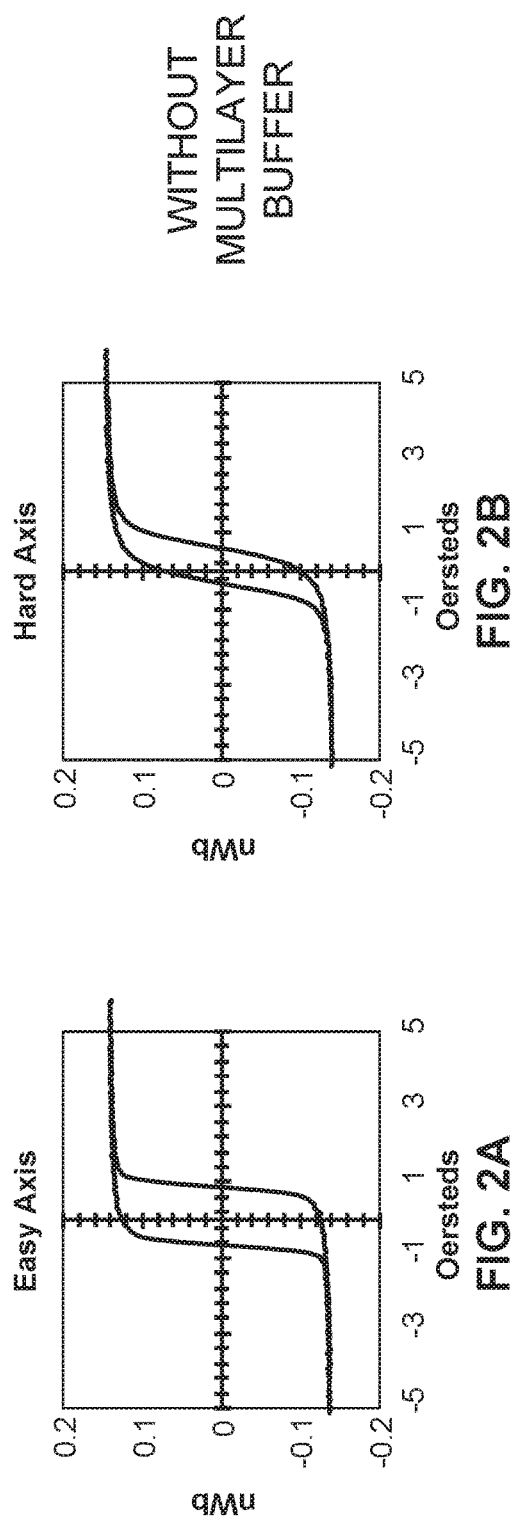
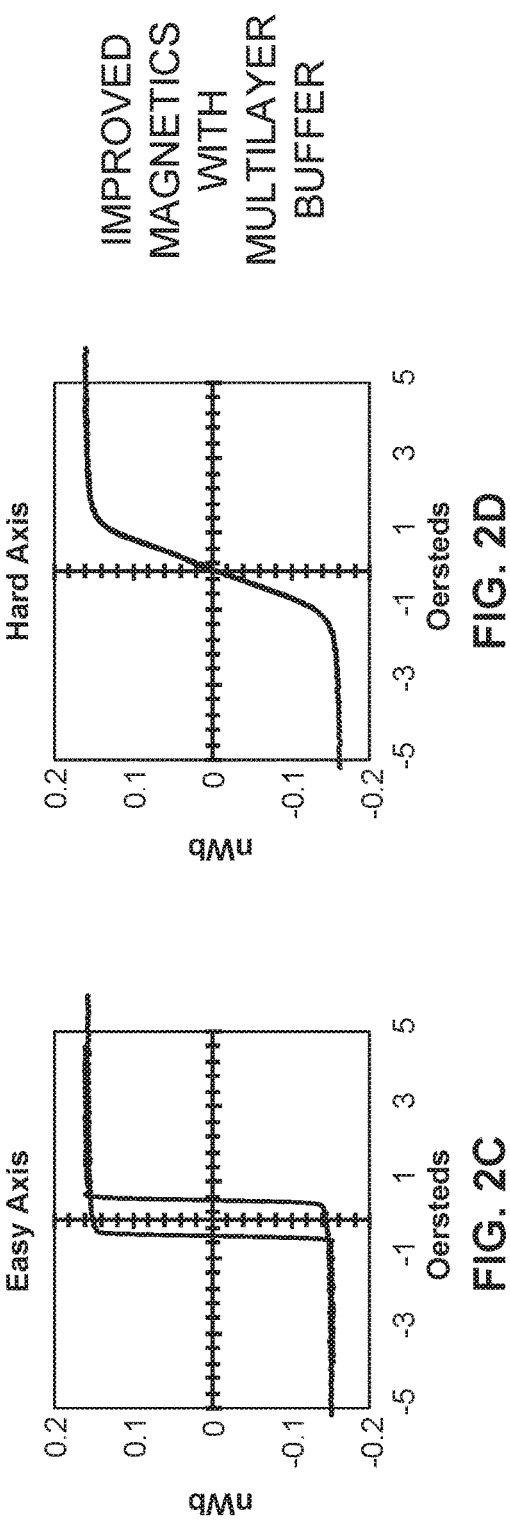

REPEATING ALTERNATING MULTILAYER BUFFER LAYER

TECHNICAL FIELD

The present invention relates generally to materials for solid-state electronic circuits, including superconducting circuits, and specifically to a repeating alternating multilayer buffer layer capable of reducing the surface roughness of an electrode contact layer.

BACKGROUND

Superconducting electronics can be implemented to provide high-performance computing with low energy consumption. Superconducting Josephson junctions with magnetic barriers, also referred to as magnetic Josephson junctions (MJJs), can serve as the basis for Josephson magnetic random access memory (JMRAM), as disclosed in U.S. Pat. No. 8,270,209 B2, entitled "Josephson Magnetic Random Access Memory System and Method," which is herein incorporated by reference. JMRAM relies on the oscillation of the relative Cooper pair phase with magnetic layer thickness to produce junctions that exhibit a Josephson phase of either zero or $\pi$, depending on the relative magnetic layer orientation. This binary phase switchability can be exploited to create superconducting memory elements capable of writing and reading a logical "0" or logical "1" state. Memory unit elements can be arranged in arrays with read and write lines to create an addressable memory fabricated, for example, on an integrated circuit (IC) chip that can be cooled to superconducting temperatures (e.g., around four kelvins) in a cryogenic chamber.

SUMMARY

One example includes a buffer layer with a stack of at least four layers of a face-centered cubic (FCC) crystal structure material, the at least four FCC material layers alternating with at least three layers of a body-centered cubic (BCC) crystal structure material, wherein each of the FCC material layers and BCC material layers is between about five and about ten angstroms thick.

Another example includes a method of fabricating an electronic device. A galvanic contact layer having a thickness of greater than five hundred angstroms and a root-mean-square upper surface roughness of between about fifteen angstroms and about twenty angstroms is deposited. A face-centered cubic (FCC) crystal structure material between about five and about ten angstroms thick is deposited on top of the galvanic contact layer. A body-centered cubic (BCC) crystal structure material between about five and about ten angstroms thick is deposited on top of the FCC crystal structure material. The FCC material deposition is repeated at least three more times, alternating with BCC material layers. The repeated alternating FCC material layers and BCC material layers together form a buffer layer having an upper surface that is smoother than the upper surface of the galvanic contact layer.

Yet another example includes a superconducting device having a lower substrate layer of silicon, and, above the substrate layer, a galvanic contact layer of niobium between about twelve hundred angstroms and about two thousand angstroms thick, followed by, on top of the galvanic contact layer, a buffer layer comprising alternating layers of copper and niobium. The number of alternating copper layers in the buffer layer is N, and the number of alternating niobium layers is either N−1 or N, where N is four or greater.

BRIEF DESCRIPTION OF THE DRAWINGS

FIG. 1A is a layer diagram of an example multilayer buffer layer.

FIG. 1B is a layer diagram of an example electronic device layer stack that includes the buffer layer of FIG. 1A.

FIGS. 2A-2D are graphs of example hysteresis loops for a magnetic-device layer stack fabricated with (FIGS. 2C and 2D) and without (FIGS. 2A and 2B) a multilayer buffer layer of the type shown in FIG. 1A.

DETAILED DESCRIPTION

Figure 3:
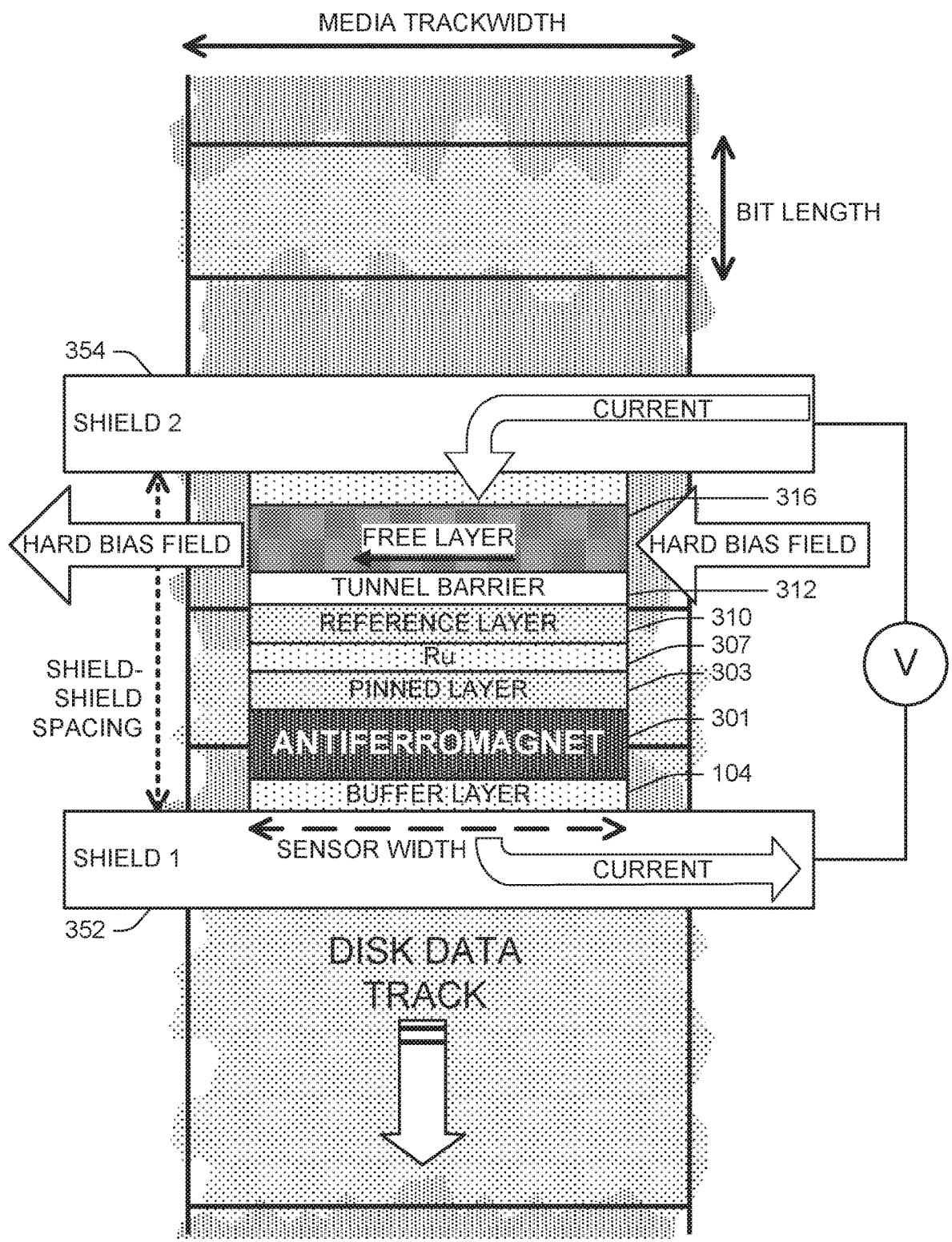
FIG. 3 is a layer diagram of an example hard disk drive reader using a multilayer buffer layer of the type shown in FIG. 1A.

A multilayer buffer layer can be used to improve the magnetics of spin valves, such as magnetic Josephson junction (MJJ) devices. The buffer layer improves switching performance by effectively sharpening the hysteresis curve of the device, thereby reducing error rate when the MJJ device is used, for example, in a Josephson magnetic random access memory (JMRAM) memory cell, to construct a robust and reliable cryogenic computer memory that can be used for high-speed superconducting computing, e.g., with clock speeds in the microwave frequency range. In other example applications, the multilayer buffer layer can be used in a room-temperature magnetoresistive random-access memory (MRAM) device or in a hard disk drive reader.

An MJJ is similar to a room-temperature (i.e., non-superconducting) MRAM cell in that it has a free magnetic layer capable of writing a magnetic state and a fixed magnetic layer used to reference the written magnetic state. Accordingly, the respective orientations of the layers represent one of two binary states: an antiparallel orientation of the magnetic layers with respect to each other can be used to represent, e.g., a logical "0," whereas, when the orientation is reversed using a magnetic field, a resultant parallel orientation of the magnetic layers with respect to each other can be used to represent, e.g., a logical "1." An MJJ differs from MRAM in both operating temperature (the MJJ being configured to operate at the cryogenic temperatures characteristic of superconducting circuits) as well as the use of superconducting material (e.g., niobium) as its contact layers. Additionally, in an MRAM cell, readback is performed via a resistance measurement, whereas readback of an MJJ is based on detecting the superconducting phase of the memory cell.

Construction of reliable memories using MJJs has posed challenges in optimizing simultaneously the magnetics and superconductivity of the MJJ devices. The presently described materials and devices address this dual problem with a multilayer buffer layer capable of more effectively smoothing the surface roughness of a base electrode layer and thereby improving the magnetics of the MJJ or other device. Good, well-controlled magnetics are especially beneficial for a low-temperature memory that requires minimal power to switch bit states from a "0" to a "1" and reduce bit errors (half-select process) due to neighboring bits being switched during write operations. A multilayer buffer layer as described herein can improve the magnetics of an MJJ while at the same time maintaining acceptable critical-current transparency of the MJJ layer stack.

FIGS. 1A and 1B show an example multilayer buffer layer 104 and its place in an example spin valve device stack 100, such as may be used to construct an MJJ or similar device. Multilayer buffer layer 104 consists of alternating layers 10, 12 of materials of differing crystal phase that are immiscible with respect to each other, with the stack having N layers 10, where N is four or greater. In some examples, N is six. The stack can have either N−1 layers 12, as illustrated, or can have N layers 12, i.e., with one additional layer 12 (not shown) on top of the top layer 10. As an example of materials of differing crystal phase, the material of every other layer in the multilayer buffer layer 104 can have a face-centered cubic (FCC) unit cell, while the material of alternating layers between the FCC layers can have a body-centered cubic (BCC) unit cell. In the illustrated example 104, material layers 10 are FCC and material layers 12 are BCC. By "immiscible with respect to each other," it is meant, among other things, that the materials 10, 12 do not tend to alloy with each other, such that a sharp interface is achieved between the two materials 10, 12, i.e., the two materials do not intermix at the interfaces between them. In some examples, material 10 is copper (Cu) and material 12 is niobium (Nb). In other examples, material 10 is copper and material 12 is tantalum (Ta). In still other examples, copper can be alternated alternately with niobium and tantalum. Each layer 10, 12 can be between about five and about ten angstroms in thickness. Optimization of the individual layer thicknesses as well as the number of repeats N can be adjusted for each particular application, i.e., for different thicknesses of the base electrode 102 as well as different base-electrode material.

A superlattice has been found to form at around N equals three or four repeats, where the atoms of the layers order to resemble a single-crystal arrangement. N equals six repeats has been found to provide both good magnetics while also providing good transport behavior, whereas after six repeats, diminishing returns have been observed: the magnetics are not necessarily improved with the increase in stack complexity and thus fabrication cost.

Buffer layer 104 is metallic and its overall thickness can be, for example, less than one hundred angstroms to allow for minimal degradation of the superconducting current that must pass through the magnetic spin valve 100. The difference in crystal structure between layers 10, 12 acts to phase-break the columnar growth found in base electrode 102, while still keeping the same growth direction, e.g., along the [110] azimuth. An alternating aluminum-niobium multilayer buffer 104 does not drastically improve the surface roughness of base electrode 112 because niobium and aluminum grow epitaxially with respect to each other and do not phase-break the columnar growth.

FIG. 1B shows an example layer structure of a spin valve device 100, such as an MJJ or similar device, having a layer stack fabricated on a substrate 101, such as a silicon wafer. For example, device 100 can have a barrier 144 between two galvanic terminals that, in accordance with the provision of appropriate control inputs, switches between magnetic alignment states respectively representative of binary logical values "0" and "1" and is readable for those states when implemented in a memory cell.

As shown, example spin valve device 100 consists of at least base and top electrode layers 102, 122 each made of a superconducting material, and, in between the electrode layers, a first magnetic layer 110 and a second magnetic layer 116. Either of first or second magnetic layers 110, 116 can be bilayer of different magnetic materials, as described in U.S. patent application Ser. No. 16/256,547, entitled "Ferrimagnetic/Ferromagnetic Exchange Bilayers for Use as a Fixed Magnetic Layer in a Superconducting-Based Memory Device," which is herein incorporated by reference. First and second buffer layers 104, 120 can separate the magnetic layers 110, 114 from the respective superconducting-material electrodes 102, 122. A normal-metal spacer layer 112 can separate the magnetic layers 110, 116 from each other. For example, first magnetic layer 110 can serve as a "free" or "switching" layer fabricated using soft magnetic materials with relatively low magnetic coercivity, and magnetic layer 116 can serve as a "fixed" layer, or vice-versa. Together, the illustrated layers can form a pillar that can be on the order of one micrometer by one micrometer in size, typically elliptical in shape, when viewed in a plan view.

Electrodes 102, 122 can be fabricated of a superconducting material, e.g., niobium, niobium nitride, or aluminum. As an example, base electrode 102 can have a thickness of between about five hundred angstroms and about two thousand angstroms, e.g., about fifteen hundred angstroms, and top electrode 122 can have a thickness of between about two hundred angstroms and about one thousand angstroms, e.g., about five hundred angstroms. First buffer layer 104 can be included to smooth out roughness in the superconductor layer 102, and can be implemented as the multilayer shown in FIG. 1A. Nonmagnetic spacer layer 112 can be included to separate the magnetic layers 110, 116 and can be fabricated, for example, of any one of elemental copper (Cu), elemental ruthenium (Ru), elemental iridium (Ir), or elemental rhodium (Rh). Spacer layer 112 can have a thickness of, for example, between about twenty-five angstroms and about seventy-five angstroms, e.g., about fifty angstroms. Second buffer layer 120, which can also be called a capping layer, can be included to prevent interdiffusion and as a smoothing layer, and can be fabricated, for example, of copper and can have a thickness of about fifty angstroms.

First magnetic layer 110 can, for example, be made of 80:20 nickel-iron (permalloy) ($Ni_{80}Fe_{20}$) and can have a thickness of between about five angstroms and about twenty angstroms, e.g., about fifteen angstroms or about sixteen angstroms. First magnetic layer 110 can also, for example, be made of any one of elemental nickel (Ni), elemental cobalt (Co), elemental iron (Fe), a cobalt-iron alloy (e.g., 1:1 CoFe), a nickel-iron alloy (NiFe), or a nickel-iron-chromium alloy (NiFeCr). In the case of each alloy mentioned, many different alloy concentrations can be used, provided that the alloy concentration is magnetic.

Particularly when a thick niobium film is used for base electrode 102, base electrode 102 can have an inherently large top-surface roughness, due to columnar growth that results in a "rice grain" surface morphology. For example, a fifteen hundred angstrom thick niobium layer can have a root-mean-square (RMS) surface roughness as large as between about fifteen angstroms and about twenty angstroms. This surface roughness of base electrode 102 can be detrimental to achieving good magnetics in ultrathin films grown on top of base electrode 102, such as first magnetic layer 110. This is because when a thin-film magnetic layer is grown directly on top of a thick niobium layer, the resulting film is discontinuous and possesses relatively poor magnetic hysteresis (low magnetic squareness, high coercivity, and minimal anisotropy). Multilayer structure 104 can be used as a buffer between base electrode 102 and first magnetic layer 110 to create a smooth starting surface for growth of high-quality ultra-thin magnetic films, such as permalloy. The buffer layer 104 modifies the existing base electrode morphology and changes it to a more appropriate smoother surface such that ultrathin magnetic layers with improved magnetic properties can be deposited directly on top of the buffer layer 104. The difference in crystal structure between the materials of the two layers 10, 12 in the multilayer buffer layer 104 provides a unique surface morphology with low RMS surface roughness as compared, for example, to a thick niobium base electrode 102.

FIGS. 2A-2D provide four graphs of example hysteresis loops, which can also be termed magnetic reversal loops, for a magnetic-device layer stack fabricated with a multilayer buffer layer of the type shown in FIG. 1A (FIGS. 2C and 2D) and, by contrast, with only a uniform-composition buffer layer (FIGS. 2A and 2B), in this case a copper unilayer. FIGS. 2A and 2B show, respectively, easy axis and hard axis hysteresis loops illustrating the magnetics of a fifteen-angstrom-thick permalloy-film magnetic layer grown on a fifteen-hundred-angstrom-thick niobium base electrode, with a fifty-angstrom-thick buffer layer of copper as the only thing between the base electrode and the magnetic layer. These graphs can be compared to those of FIGS. 2C and 2D, which show, respectively, easy axis and hard axis hysteresis loops illustrating the magnetics of a similar fifteen-angstrom-thick permalloy film grown on a cooper-niobium multilayer having seven ten-angstrom-thick layers of copper alternating with six five-angstrom-thick layers of niobium. In both fabrication processes, an etch clean follows the base electrode growth and precedes the buffer layer deposition.

As can be seen by the comparison, the magnetics of the permalloy magnetic layer grown on the multilayer are superior, such that the permalloy magnetic layer possesses high squareness, low coercivity, and high anisotropy. For example, it can be noted in FIGS. 2C and 2D by comparison to their respective counterparts in FIGS. 2A and 2B that the width of the hysteresis loops is lower with the multilayer buffer layer. As an example, in the easy axis loops, the hysteresis curve of FIG. 2A crosses that x-axis at about 1.5 oersteds, whereas the hysteresis curve of FIG. 2C crosses the x-axis at about 0.5 oersteds. Similar behavior can be noted in both the hard axis loops. As compared to the multilayer buffer layer example of FIG. 2D, there is a considerably broader hysteresis curve width in the hard axis graph of FIG. 2B, where only copper is used as a buffer layer. The sharpening of the hysteresis curves is the result of the multilayer buffer layer effectively taking the roughness out of the upper surface of the base electrode layer, offering more coherent magnetic switching and providing a result closer to that of single-domain switching.

Figure 4:
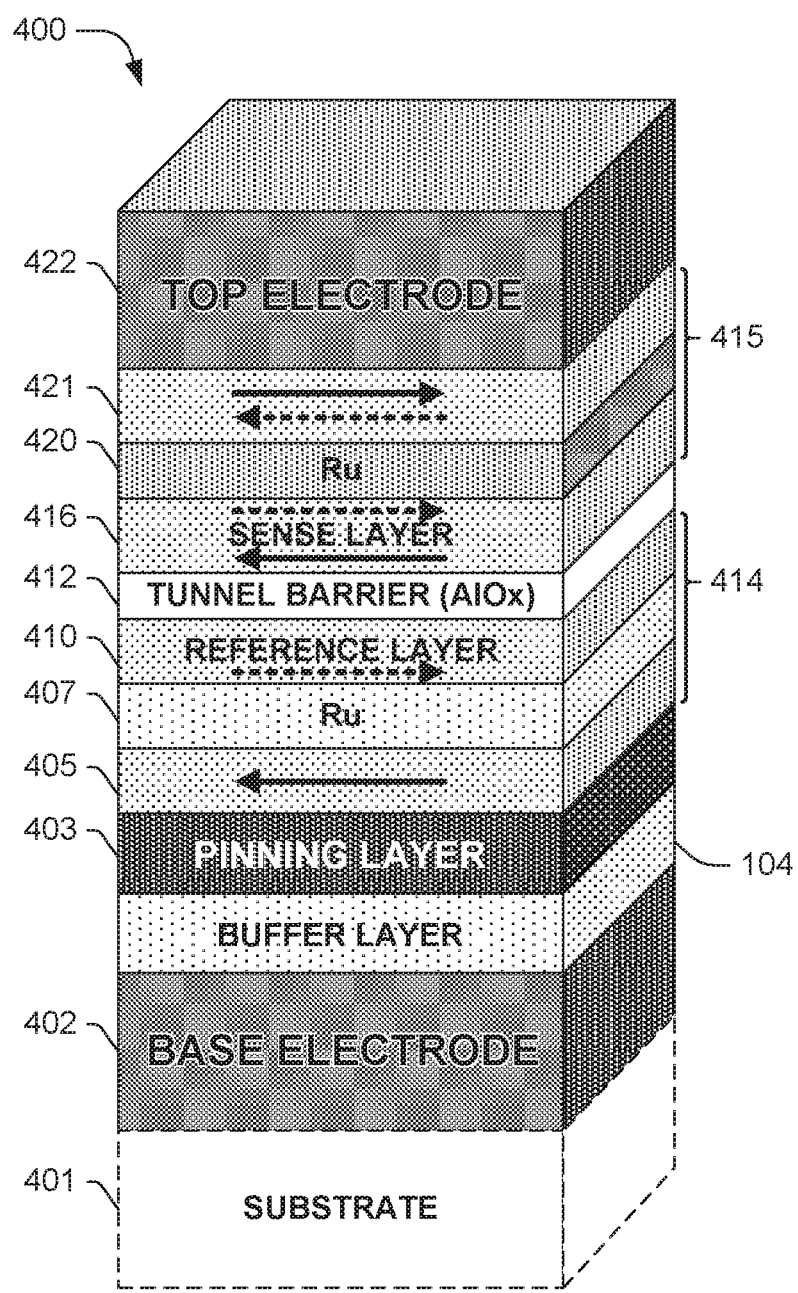
FIG. 4 is a layer diagram of an example room-temperature MRAM device using a multilayer buffer layer of the type shown in FIG. 1A.

FIGS. 3 and 4 illustrate applications of the multilayer buffer layer 104 other than in an MJJ. FIG. 3 illustrates a hard disk drive reader having a number of layers including an antiferromagnet 301, a pinned layer 303, a ruthenium (Ru) layer 307, a reference layer 310, a tunnel barrier 312, and a free layer 316. There are also two shields 352, 354, which can be, for example, NiFe or some other magnetically soft ferromagnet. A buffer layer 104 like that shown in FIG. 1A and as described previously can be located between first shield 352 and antiferromagnet 301. As implemented in FIG. 3, the multilayer buffer layer obviates what otherwise might be a need to break up a copper electrode layer with, e.g., twenty-five-angstrom tantalum interruptions. FIG. 4 shows buffer layer 104, as shown in FIG. 1A and as described previously, implemented between the base electrode 402 and the pinning layer 403 of a room-temperature MRAM device layer stack 400 also having substrate 401; fixed synthetic antiferromagnet (SAF) 414 having layer 405, first ruthenium layer 407, and reference layer 410; free SAF 415 having sense layer 416, second ruthenium layer 420, and layer 421, tunnel barrier 412 (e.g., of aluminum oxide) between free and fixed SAFs 414, 415, and top electrode 422.

A superconducting memory can utilize a magnetic memory architecture where a magnetic spin valve is fabricated on a thick base electrode. For example, a Josephson magnetic random access memory (JMRAM) can include ultrathin magnetic and non-magnetic metal layers grown on a thick base electrode. When implemented, for example, in a JMRAM system, the MJJ stack structure 100 shown in FIG. 1B including the multilayer buffer layer 104 of FIG. 1A possesses switching advantages over an MJJ with, for example, a copper-only buffer layer. The use of a multilayer buffer layer as described herein improves the magnetics as shown in FIGS. 2A-2D, thus enabling a more scalable and reliable magnetic memory with minimal cost and materials impacts.

Figure 5A:
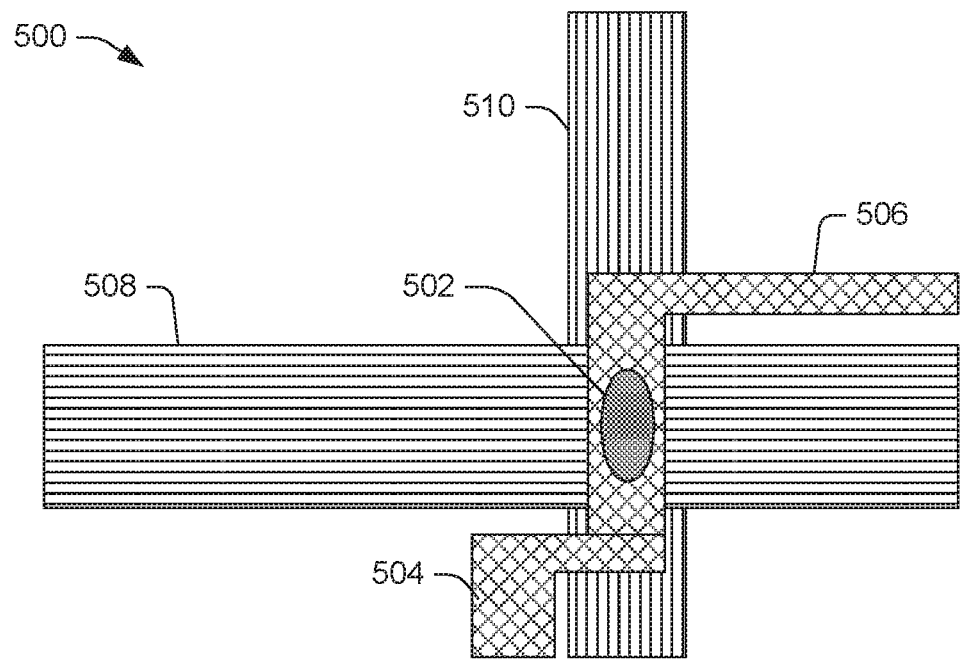
FIG. 5A is a plan view of an example MJJ-based memory element including current wires and magnetization write lines.
Figure 5B:
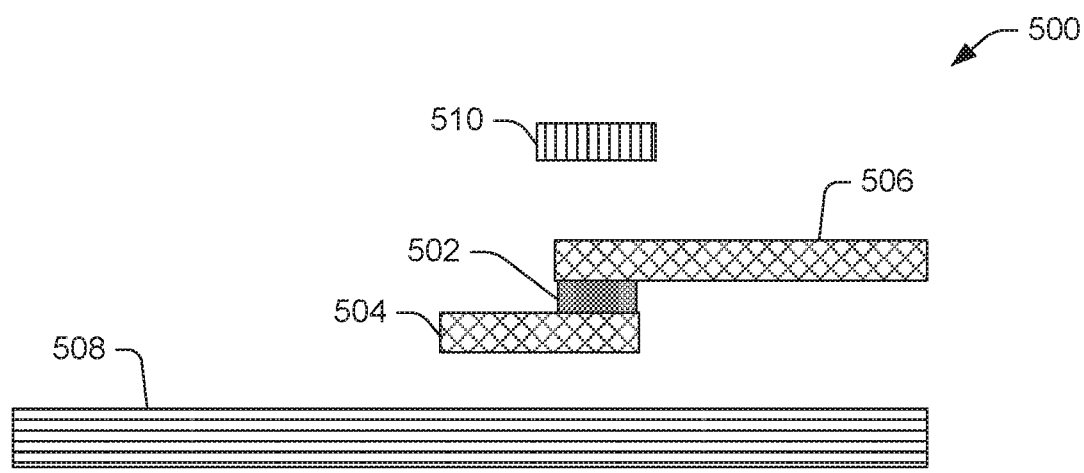
FIG. 5B is a cross-section view of the example MJJ-based memory element of FIG. 5A.

FIGS. 5A and 5B respectively show plan and cross-sectional views of a memory element 500 that can be implemented in an integrated circuit (IC) chip and can include an MJJ device 502 that can correspond, for example, to spin valve device 100 of FIG. 1B. Thus, memory element 500 can have a number of layers, including magnetic layers. In addition to MJJ 502, memory element 500 can also include current-in wire 504 and current-out wire 506 by which memory element 500 can be connected to other parts of a circuit in which memory element 500 is integrated, e.g., on an IC, such as a memory unit cell, like that illustrated in FIG. 6. Thus, for example, current-in wire 504 can be galvanically connected to or can include one of layers 102, 122 in the device 100 of FIG. 1B, while current-out wire 506 can be galvanically connected to or can include the other of layers 102, 122. Wires 504, 506 can each be fabricated, for example, from a superconducting metal, e.g., niobium, niobium nitride, or aluminum.

Memory element 500 can also include word write line 508 and bit write line 510 for writing a binary state to device 502. Write lines 508, 510 can be inductively coupled to a free magnetic layer device 502 to enable controlled switching of the free magnetic layer between a state in which its magnetization is parallel to that of the fixed magnetic layer and a state in which its magnetization is antiparallel to that of the fixed magnetic layer. Thus, establishing a current through word write line 508 and through bit write line 510 in turn generates a magnetic field that induces the magnetization direction of the free magnetic layer to reverse, which reversal remains even when the magnetic field is removed, e.g., by the cessation of current through write lines 508, 510. In contrast, the fixed magnetic layer is only affected while the magnetic field is active. Once the fields are turned off, the fixed magnetic layer returns to its original configuration. The magnetic fields generated by write lines 508, 510 are configured so as not to be high enough to drive a switch in the fixed magnetic layer. Sequential activation of the write lines can be configured to force the free magnetic layer to orient in its hard axis direction prior to tipping the magnetization into a desired direction, in a process known as high hard axis switching.

In the plan view of FIG. 5A, looking down on and normal to a transverse plane of memory element 500, bit write line 510 is illustrated as "below" other components 502, 504, 506, 508 for illustration purposes, but bit write line 510 can be "above" the other components as shown in the cross-sectional view of FIG. 5B, which looks in on and normal to a longitudinal plane of memory element 500.

In JMRAM applications, controlled DC currents are used to write states to magnetic cells in an array. On layers above and/or below the pillar 502 are a word write line 508 and a bit write line 510 forming a cross-point memory cell. When a current is sent down both of the lines, a large enough field is produced where the lines intersect to switch the bit, i.e., to change the parallel or antiparallel state of the magnetic layers of the MJJ device 502. Writing a state can thus involve putting a supercurrent through both lines 508, 510, switching the free layer, whereas reading a written state can involve sending a supercurrent through the superconducting-material contacts 504, 506 at the top and bottom of MJJ device 502, which can be connected to a superconducting quantum interference device (SQUID) configured to sense the phase of the MJJ. The magnitude of the supercurrent, if high enough to exceed the critical current of one of the Josephson junctions in the SQUID and thereby to trigger one of the Josephson junctions in the SQUID, results in a voltage pulse being propagated, on a bit read line, representing, e.g., a logical "1," whereas if the magnitude of the supercurrent is insufficiently high, due to an antiparallel orientation of the magnetic layers in the MJJ, no such voltage pulse is propagated, corresponding, e.g., to a logical "0."

Figure 6:
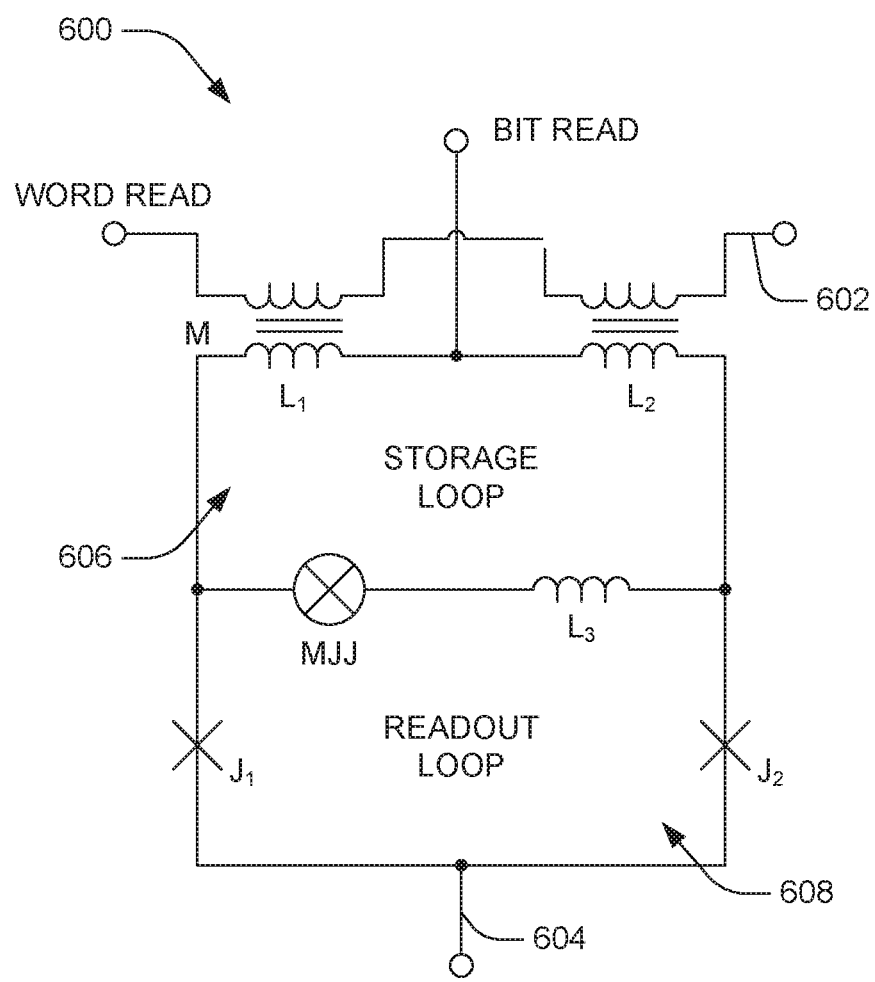
FIG. 6 is a circuit diagram of an example memory unit cell that includes an MJJ device.

FIG. 6 is a circuit schematic of an example JMRAM unit cell 600, including an rf-SQUID storage loop 606 and a direct-current dc-SQUID readout loop 608, and omitting write lines for simplicity of illustration. The storage loop 606 contains an MJJ that can correspond, for example, to device 100 of FIG. 1B or 500 of FIGS. 5A-5B, as well as inductors $L_1$, $L_2$, and $L_3$. Current provided through word read line 602 applies flux to a selected memory cell such that the current through bit read line 604 exceeds the readout SQUID critical current in one memory state, but not in the other. The storage loop 606 that encloses a spontaneously generated flux $\Phi_0/2$ when the MJJ is in a π-junction state and zero flux otherwise. The loop linear inductance is greater than the Josephson inductance of the MJJ. A portion of the stored flux is coupled into the dc-SQUID readout loop 608 and can be sensed by passing a bit-read current through bit read line 604. A word-read current through word read line 602 tunes the dc-SQUID flux such that in the memory state associated with an MJJ 7C phase ($\Phi_0/2$ in the storage loop 606), the bit-read current causes the dc-SQUID to switch to its voltage state. In the other memory state, which is associated with an MJJ zero phase, the dc-SQUID critical current is higher than the bit-read current and the dc-SQUID remains in the zero-voltage state.

Figure 7:
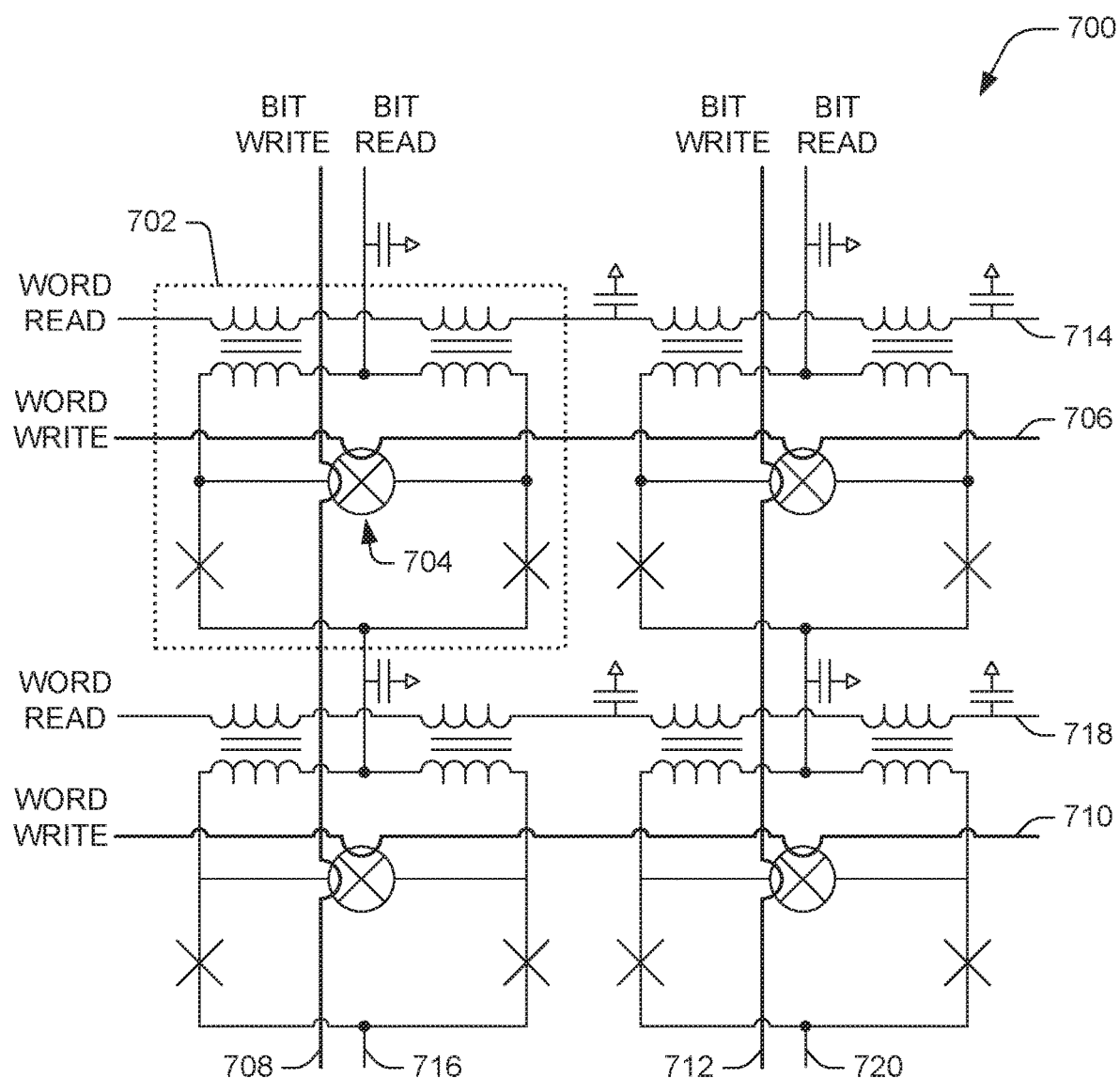
FIG. 7 is a circuit diagram of an example memory array incorporating MJJ devices.

FIG. 7 shows how unit cells 702, like unit cell 600 of FIG. 6, can be tiled to form an x-y addressable memory array 700, with word write lines 706, 710 and bit write lines 708, 712 applying hard- and easy-axis fields to each MJJ 704. Read lines 714, 718, 716, 720 use the cell inductance to form LC ladder transmission lines for fast signal propagation. Although only a 2×2 memory array is shown, larger memory arrays can be patterned similarly to create memories of arbitrary size.

Figure 8:
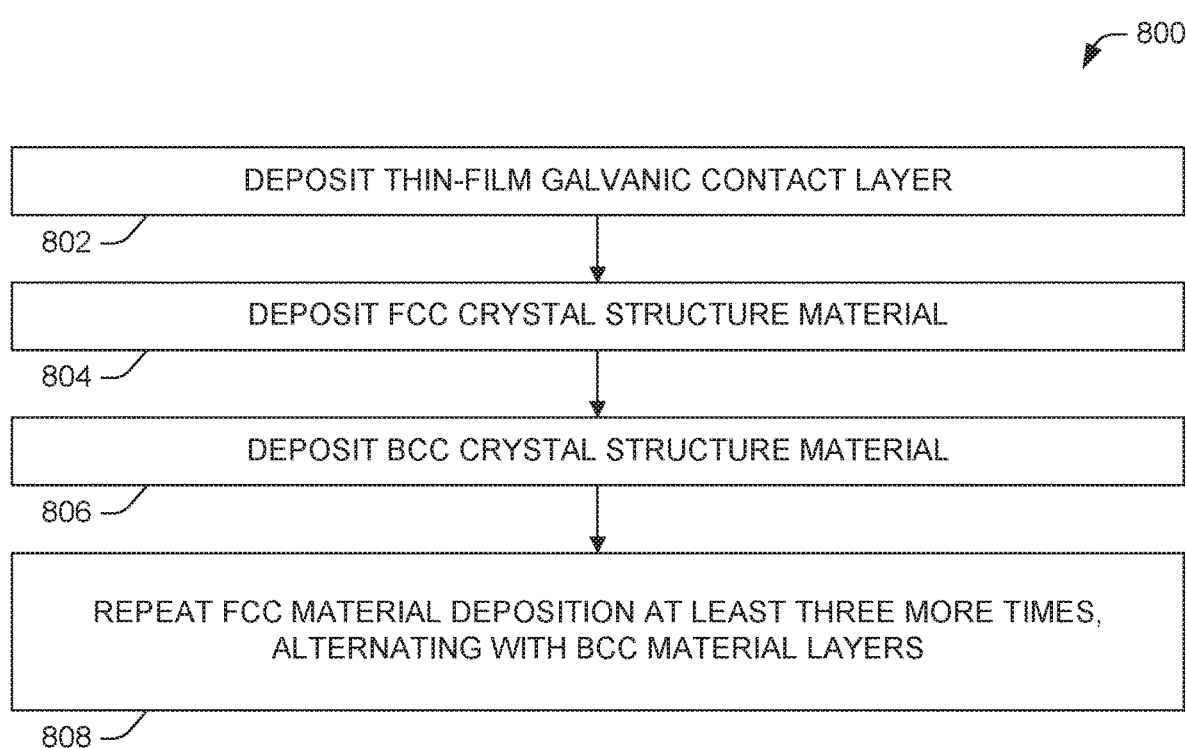
FIG. 8 is a flow diagram of an example method of fabricating an electronic device including a buffer layer of the type illustrated in FIG. 1A.

FIG. 8 shows a method 800 of fabricating a multilayer buffer layer like layer 104 illustrated in FIG. 1A. After depositing 802 (e.g., growing) a galvanic contact layer, a material having a face-centered cubic (FCC) crystal structure is deposited 804 on top of the galvanic contact layer. The galvanic contact layer can have, for example, a thickness of greater than five hundred angstroms and a root-mean-square surface roughness of between about fifteen angstroms and about twenty angstroms. For example, the galvanic contact layer can have a thickness of about fifteen hundred angstroms. The FCC crystal structure material can, for example, be between about five and about ten angstroms thick. Next, a material having a body-centered cubic (BCC) crystal structure is deposited 806 on top of the FCC crystal structure material. The FCC crystal structure material can likewise be between about five and about ten angstroms thick. The deposition of the FCC material is then repeated 808 at least three more times, alternating with BCC material layers. Again, these layers can each be between about five angstroms and about ten angstroms thick. The repeated alternating FCC material layers and BCC material layers can together form a buffer layer that smoothes the surface roughness of the galvanic contact layer.

The materials and devices described herein improve the magnetic switching of a spin valve, such as an MJJ as can be used in a JMRAM, in a way that is compatible with maintaining high critical currents through the spin valve. The present disclosure further includes a method of fabricating the materials and devices described herein, consisting of depositing in order the layers shown in FIG. 1A as described above with respect to FIGS. 1A and 1B to build up the illustrated layer stack, as further discussed with respect to FIG. 8. The insertion of a multilayer buffer layer 104 between a thick base electrode 102 and magnetic layers 114 grown there above reduces the large RMS roughness of the base electrode 102 to a suitable roughness such that there can be deposited on top of the thick base electrode 102 ultrathin magnetic layers 110, 120 having improved magnetic properties due to the smoother starting surface. The buffer layer 104 can consist, for example, of a multilayer of alternating layers 10, 12 of copper and niobium repeated at least four times, e.g., six times. The reduced roughness is a result of the phase-breaking effect that reduces the columnar growth of the base electrode material, e.g., niobium, which minimizes the rice-grain morphology. Of particular value in cryogenic memory applications, a repeating copper-niobium buffer configuration has been shown to have good critical current transparency. The multilayer buffer layer described herein can therefore be made to have critical current transparency greater than about four hundred microamps.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A buffer layer comprising:
   a stack of at least four layers of a face-centered cubic (FCC) crystal structure material, the at least four FCC material layers alternating with
   at least three layers of a body-centered cubic (BCC) crystal structure material,
   wherein each of the FCC material layers and BCC material layers is between about five and about ten angstroms thick.

2. The buffer layer of claim 1, wherein the FCC crystal structure material is copper and the BCC crystal structure material is niobium.

3. The buffer layer of claim 1, wherein the stack has six layers of the FCC crystal structure material alternating with layers of the BCC crystal structure material.

4. The buffer layer of claim 3, wherein the FCC crystal structure material is copper and the BCC crystal structure material is niobium.

5. A magnetic Josephson junction (MJJ) comprising the buffer layer of claim 1, the buffer layer being located directly on top of a lower superconducting electrode contact layer of the MJJ and below a magnetic layer of the MJJ, wherein the lower superconducting electrode contact layer is niobium and is at least five hundred angstroms thick.

6. A superconducting memory comprising a plurality of memory cells each comprising an instance of the MJJ of claim 5.

7. A room-temperature magnetoresistive random-access memory (MRAM) comprising the buffer layer of claim 1.

8. A hard disk drive reader comprising the buffer layer of claim 1.

9. The buffer layer of claim 1, wherein the buffer layer has root-mean-square upper surface roughness of less than about twenty angstroms.

10. The buffer layer of claim 1, wherein the buffer layer has root-mean-square upper surface roughness of less than about fifteen angstroms.

11. A device comprising a switching magnetic layer fabricated over the buffer layer of claim 1, wherein the magnetic layer has an easy axis and a hard axis each characterized by a respective hysteresis loop, the easy axis hysteresis loop having a squareness of greater than about 0.9, and the hard axis hysteresis loop having a squareness of less than about 0.1.

12. A device comprising a switching magnetic layer fabricated over the buffer layer of claim 1, the magnetic layer having an easy axis and a hard axis, the hard axis having a coercivity of less than about 0.2 oersteds.

13. A superconducting device comprising:
    a lower substrate layer of silicon;
    above the substrate layer, a galvanic contact layer of niobium between about twelve hundred angstroms and about two thousand angstroms thick; and
    on top of the galvanic contact layer, a buffer layer comprising alternating layers of copper and niobium, the number of alternating copper layers in the buffer layer being N, the number of alternating niobium layers being either N−1 or N, where N is four or greater.

14. The device of claim 13, wherein the alternating layers of copper and niobium in the buffer layer are each between about five angstroms and about ten angstroms thick.

15. The device of claim 13, wherein N is six.

16. The device of claim 13, wherein the device is a magnetic Josephson junction (MJJ).

17. The device of claim 13, further comprising, on top of the buffer layer, a magnetic layer.

18. The device of claim 13, wherein the buffer layer has root-mean-square upper surface roughness of less than about twenty angstroms.

19. The device of claim 13, wherein the buffer layer has root-mean-square upper surface roughness of less than about fifteen angstroms.

20. The device of claim 17, wherein the magnetic layer is a free magnetic layer having an easy axis and a hard axis each characterized by a respective hysteresis loop, the easy axis hysteresis loop having a squareness of greater than about 0.9, the hard axis hysteresis loop having a squareness of less than about 0.1, and the hard axis having a coercivity of less than about 0.2 oersteds.

* * * * *